US009490345B2

(12) United States Patent
Chen et al.

(10) Patent No.: US 9,490,345 B2
(45) Date of Patent: Nov. 8, 2016

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: I-Chih Chen, Tainan (TW); Fu-Tsun Tsai, Tainan (TW); Yung-Fa Lee, Tainan (TW); Ko-Min Lin, Tainan (TW); Chih-Mu Huang, Tainan (TW); Ying-Lang Wang, Tai-Chung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/530,320

(22) Filed: Oct. 31, 2014

(65) Prior Publication Data
US 2015/0206946 A1 Jul. 23, 2015

Related U.S. Application Data

(63) Continuation-in-part of application No. 14/158,643, filed on Jan. 17, 2014.

(51) Int. Cl.
| H01L 29/417 | (2006.01) |
| H01L 29/45 | (2006.01) |
| H01L 21/324 | (2006.01) |
| H01L 29/78 | (2006.01) |
| H01L 29/66 | (2006.01) |
| H01L 29/08 | (2006.01) |
| H01L 21/285 | (2006.01) |
| H01L 29/165 | (2006.01) |
| H01L 21/265 | (2006.01) |
| H01L 21/768 | (2006.01) |

(52) U.S. Cl.
CPC ... *H01L 29/66636* (2013.01); *H01L 21/28518* (2013.01); *H01L 29/0847* (2013.01); *H01L 29/165* (2013.01); *H01L 29/41775* (2013.01); *H01L 29/41783* (2013.01); *H01L 29/665* (2013.01); *H01L 29/66628* (2013.01); *H01L 29/7848* (2013.01); *H01L 21/26506* (2013.01); *H01L 21/76814* (2013.01)

(58) Field of Classification Search
CPC .......... H01L 29/665; H01L 29/66636; H01L 21/823814; H01L 29/41783; H01L 29/66628; H01L 29/7834; H01L 21/28518; H01L 29/41775; H01L 29/0843; H01L 29/0847; H01L 29/0869; H01L 29/0886
See application file for complete search history.

(56) References Cited

U.S. PATENT DOCUMENTS 5,012,306 A * 4/1991 Tasch, Jr. ............ H01L 29/0847
257/335
2010/0221883 A1 * 9/2010 Kronholz .......... H01L 21/82381
438/285

(Continued)

*Primary Examiner* — Ermias Woldegeorgis
*Assistant Examiner* — John Bodnar
(74) *Attorney, Agent, or Firm* — WPAT, P.C., Intellectual Property Attorneys; Anthony King

(57) ABSTRACT

A semiconductor device includes a gate structure on a substrate; a raised source/drain region adjacent to the gate structure; and an interconnect plug on the doped region. The raised source/drain region includes a top surface being elevated from a surface of the substrate; and a doped region exposed on the top surface. The doped region includes a dopant concentration greater than any other portions of the raised source/drain region. A bottommost portion of the interconnect plug includes a width approximate to a width of the doped region.

20 Claims, 11 Drawing Sheets

(56) References Cited

U.S. PATENT DOCUMENTS

2011/0147828 A1* 6/2011 Murthy ............. H01L 21/02057
257/327

2013/0249006 A1* 9/2013 Khakifirooz .......... H01L 27/088
257/368

* cited by examiner

SEMICONDUCTOR DEVICE AND MANUFACTURING METHOD THEREOF

CROSS REFERENCE TO RELATED APPLICATION

This application is a continuation-in-part (CIP) application of prior application Ser. No. 14/158,643, filed on 17 Jan. 2014 by the present inventor, entitled "SEMICONDUCTOR DEVICE AND MANUFACTURING METHOD THEREOF", which is hereby incorporated by reference.

FIELD

The present disclosure relates to a semiconductor device and in particular, to a semiconductor device with a more efficient electrical performance and a method of manufacturing a semiconductor device.

BACKGROUND

A significant trend throughout integrated circuit (IC) development is the downsizing of IC components. As the size reduces, the performance requirements become more stringent. Also, as devices continue to shrink in size, the channel region continues to shrink as well. For metal-oxide-semiconductor field effect transistors (MOSFETs), increased performance requirements have generally been met by aggressively scaling the length of the channel region. However, such a short channel length faces high electric field and manufacturing limits.

With regard to the scaling of integrated circuits, the current performance of devices is highly relative to the total resistances of such devices. The device drive currents are inversely proportional to the total resistance. The total resistance includes a channel resistance $R_{CH}$ and an external resistance $R_{EXT}$. In 45 nm technology and below, the external resistance $R_{EXT}$ dominates performance of the device drive currents. In addition, it is found that contact resistance holds a majority of the external resistance $R_{EXT}$. However, high contact resistance causes the device drive currents to reduce. In order to obtain higher drive currents, a new structure with a low contact resistance and its manufacturing method are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
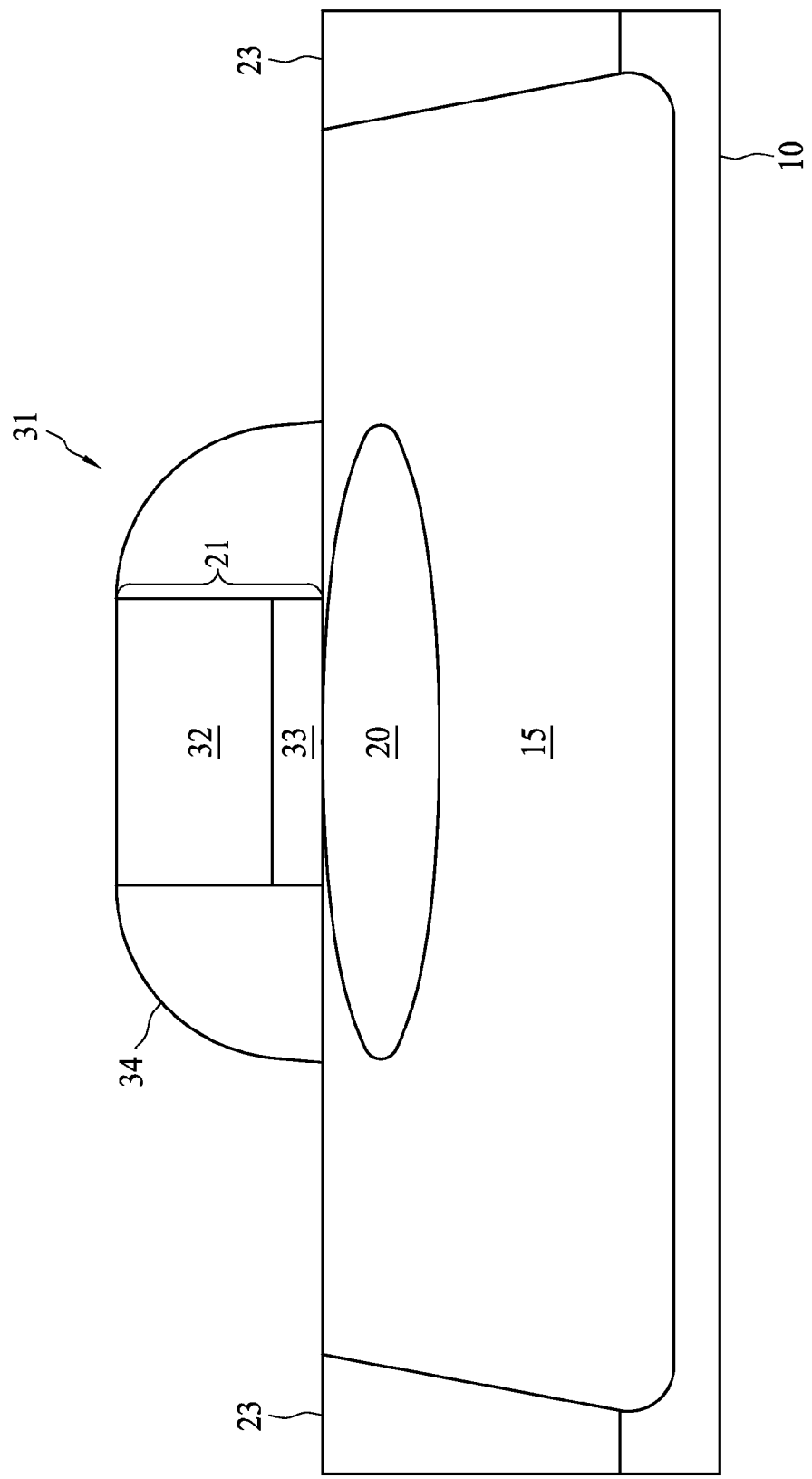
FIGS. 1-11 represent a method of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

IC manufacturers have made great effort to improve the performance of NMOS and PMOS transistors. One technique for improving performance is to reduce the channel length of the transistors. However, reduction of the physical size of the transistor has faced a physical and electrical limitation due to manufacturing tools and techniques. Thus, IC manufacturers have turned to develop other techniques to improve the performance of NMOS and PMOS transistors. Another technique used to improve device performance is to establish certain strain in the channel region of the transistors. One or more layers of material, such as silicon carbide or silicon germanium, are formed partially under or adjacent to the channel region so as to induce strain in the channel region of the transistor. In NMOS transistors, it is designed to create a tensile stress in the channel regions so as to increase the mobility of carriers. In contrast, it is designed to create a compressive stress in the channel regions of the PMOS transistors. Thus, the stress in the channel region improves the switching speed and drive current.

Another technique used to improve the device performance is to reduce the total resistances of such devices. With regard to the scaling of integrated circuits, the current performance of devices is highly relative to the total resistances of such devices. In recent and next generation IC technology, the external resistance $R_{EXT}$ dominates the performance of the device drive currents. The external resistance $R_{EXT}$ results from source/drain extension region resistance, source/drain resistance, source/drain contact resistance, and interconnect resistance. In addition, it is found that source/drain contact resistance holds a majority of the external resistance $R_{EXT}$. High contact resistance causes the device drive currents to be reduced. One of the approaches adopted in the industry is highly doping the source/drain regions with impurity so as to reduce the source/drain contact resistance. However, as the dopant concentration reaches about 1E20 atoms/cm$^3$, the dopants will easily diffuse into channel regions and induce short channel effects during a thermal process. In the present disclosure, a semiconductor device is fabricated to include a low resistance contact region to reduce the source/drain contact resistance, while still maintaining the high dopant concentration in the source/drain regions.

FIGS. 1-10 represent a method of manufacturing a semiconductor device in accordance with some embodiments of the present disclosure. Each figure represents a stage of the method in a cross-sectional perspective view.

Referring to FIG. 1, a gate structure 31 is formed on a substrate 10, wherein the substrate 10 includes a doped well region 15, isolations 23 and a channel region 20. The gate structure 31 includes a gate electrode 32, a gate dielectric 33 and sidewall spacers 34. The isolations 23 define active regions of each metal oxide semiconductor devices. In addition, the isolations 23 are configured to isolate various devices from one another. The isolations 23 are made of dielectric materials, such as oxide or nitride, by using local oxidation of silicon (LOCOS) or shallow trench isolation (STI). Those skilled in the art shall understand the various steps used to form the isolations 23. The substrate 10 is a silicon substrate or made of materials other than silicon, for example, silicon germanium, silicon carbide, germanium, III-V compound semiconductors. In an embodiment, the substrate 10 is made of a silicon-on-insulator (SOI) substrate. The SOI substrate includes a bulk silicon layer, a buried insulation layer and an active layer, wherein semiconductor devices are formed in and above the active layer.

After forming the isolations 23, an implantation or a diffusion process (not shown) is performed to form the doped well region 15 between the isolations 23. The doped well region 15 includes a p-type dopant or an n-type dopant. In an embodiment, the doped well region 15 is an n-type well. Thus, the doped well region 15 includes dopants, for example, phosphorous, arsenic, and/or antimony. In an embodiment, the doped well region 15 is a p-type well. Thus, the doped well region 15 includes dopants, for example, boron, germanium, and/or indium. Since the doped well region 15 is a foundation for manufacturing devices, a channel region 20 obtains features of the doped well region 15. As such, the channel region 20 includes a dopant material that is the same as that of the doped well region 15.

Later, a gate dielectric layer and a gate electrode layer is deposited and then patterned to form a stack 21 of a gate electrode 32 and a gate dielectric 33. The gate dielectric 33 is located on the channel region 20. In some embodiments, the gate dielectric 33 is made of silicon dioxide or a high dielectric constant (K) material. In some embodiments, the gate dielectric 33 includes a dielectric material based on silicon oxide, e.g., silicon oxynitride or a stack of at least one silicon oxide and at least one silicon nitride. In some embodiments, the gate dielectric 33 includes a dielectric metal oxide having a dielectric constant greater than 8.0, which is known as a high-k dielectric material. Exemplary high-k dielectric materials include $HfO_2$, $ZrO_2$, $La_2O_3$, $Al_2O_3$, $TiO_2$, $SrTiO_3$, $LaAlO_3$, $HfO_xN_y$, $Y_2O_3$, $LaAlO_xN_y$, $Al_2O_xN_y$, $ZrO_xN_y$, $La_2O_xN_y$, $TiO_xN_y$, $SrTiO_xN_y$, $Y_2O_xN_y$, and an alloy thereof. Each value of x is independently from 0.1 to 3.0 and each value of y is independently from 0.1 to 2.0.

The gate electrode 32 is located on the gate dielectric 33. In some embodiments, the gate electrode 32 includes standard polysilicon with doping, which refers to a poly-gate. Alternatively, the gate electrode 32 includes amorphous silicon material, a metal material, silicide metal material, or a stack of at least one metallic material and at least one semiconductor material. The gate electrode 32 serves as a gate terminal in order to control the channel region 20. The material is chosen to meet the requirement of resistance.

Next, a conformal layer of gate sidewall material is deposited on the stack 21 in a blanketed fashion by using a CVD process with an appropriate thickness. Thereafter, the conformal layer of gate sidewall material is subjected to an anisotropic etch, thus resulting in sidewall spacers 34. The sidewall spacers 34 conform to the stack 21 of the gate electrode 32 and the gate dielectric 33. In addition, the sidewall spacers 34 are respectively located on opposite sides of the stack 21. In some embodiments, the sidewall spacers 34 include silicon nitride, silicon dioxide, silicon carbide, or silicon oxy-nitride, without limitation. Specifically, the material of the sidewall spacers 34 is different from the material of the gate electrode 32 or the gate dielectric 33.

The channel region 20 is disposed under the gate structure 31. The channel region 20 is formed in the substrate 10. In an embodiment, the channel region 20 is n-type and includes dopants, for example, phosphorous, arsenic, and/or antimony. In an embodiment, the channel region 20 is p-type and includes dopants, for example, boron, germanium, and/or indium.

Figure 2:
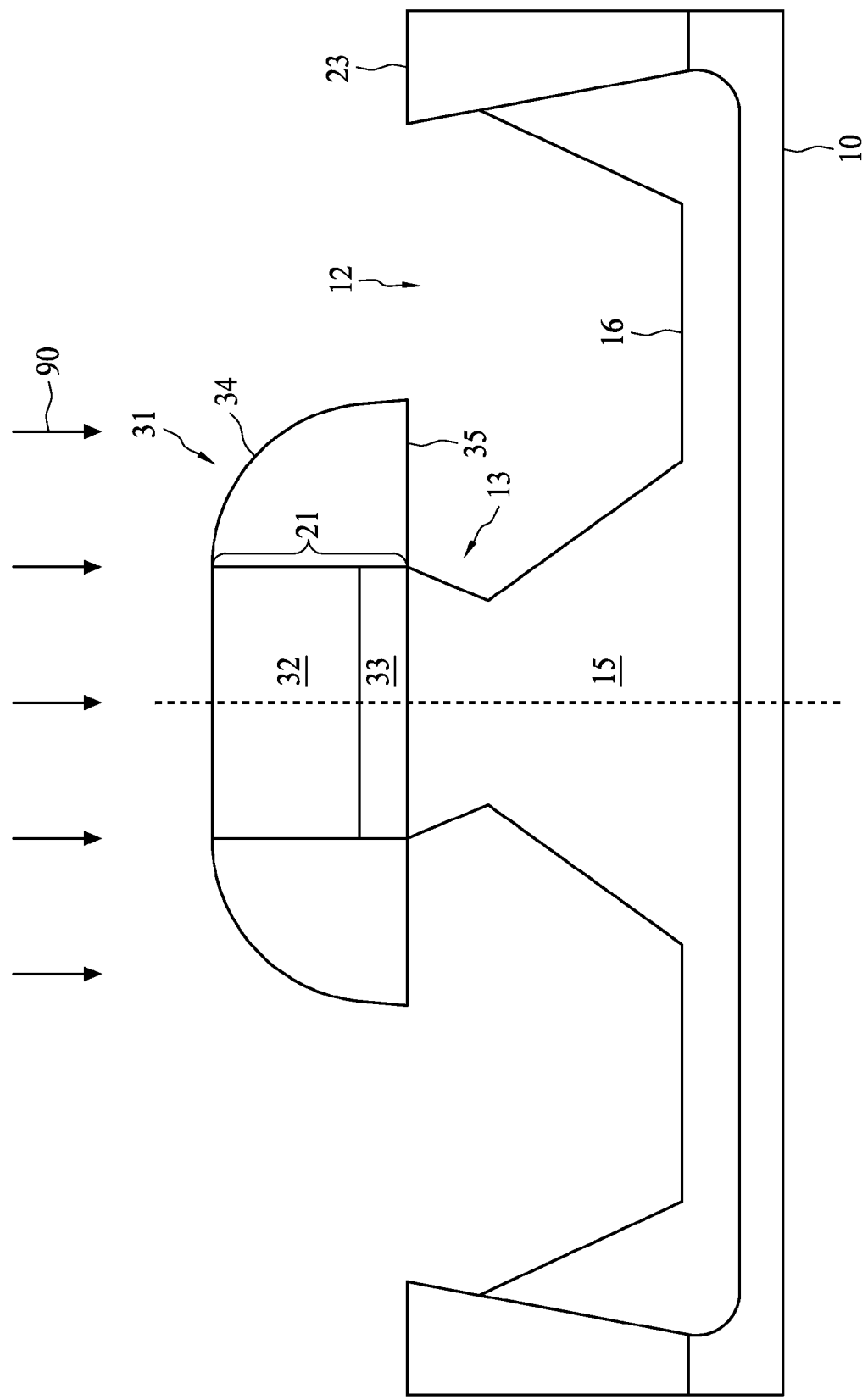

Referring to FIG. 2, a cavity 12 is formed in the substrate 10 and adjacent to the gate structure 31 by using an etch process 90, wherein the gate structure 31 serves as a mask. In an embodiment, a protect layer (not shown) may be deposited and patterned on the gate structure 31 and other regions for protection. The cavity 12 is vertically formed into the substrate 10 with a depth, for example, between about 10 nm and about 80 nm. It is also within the scope of the disclosure to etch the cavity 12 to any suitable depth. The cavity 12 thus exposes a surface 16, wherein the surface 16 extends from a bottom portion 35 of the gate structure 31 to the isolation 23. The surface 16 includes a U-shaped profile or a polygon profile. The cavity 12 further includes a corner 13 under the gate structure 31, wherein the corner 13 exposes the bottom portion 35. The etching process 90 is a wet etching with isotropic feature that undercuts a portion of the substrate 10 under the gate structure 31. The semiconductor material under the gate structure 31 is encroached so as to form the corner 13 between the bottom portion 35 and the surface 16. In an embodiment, a hydrogen bake treatment is performed on the surface 16 for pre-treatment. The hydrogen bake treatment desorbs oxygen and renders surface reconstruction so that the surface 16 can be nucleated without formation of defects.

Figure 3:
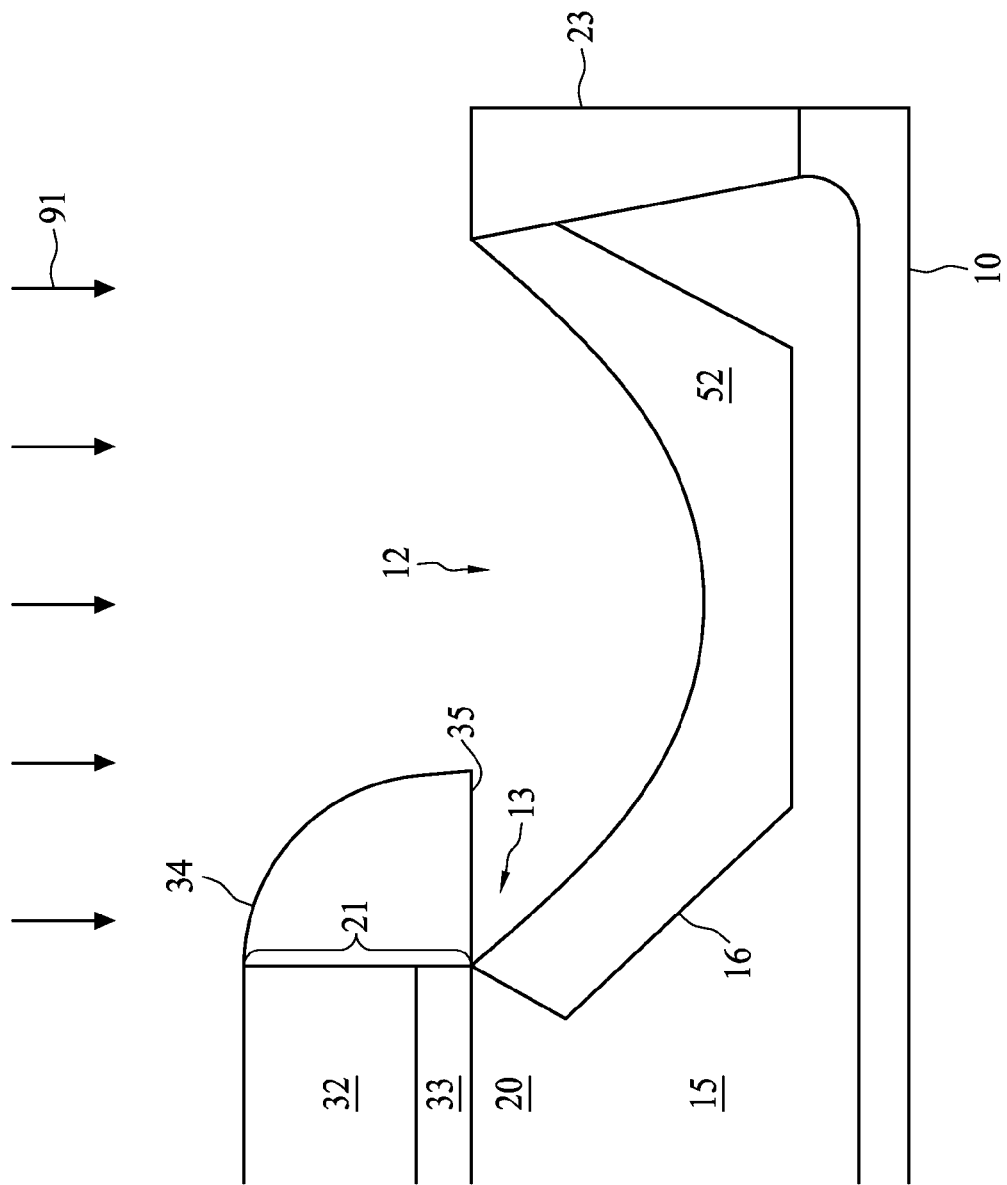

Referring to FIG. 3, an epitaxial deposition 91 is performed to selectively form a first epitaxial-grown doped layer 52 on the surface 16. The first epitaxial-grown doped layer 52 extends from the corner 13 to the isolation 23. Further, an end portion of the first epitaxial-grown doped layer 52 fills a portion of the corner 13. The epitaxial deposition 91 includes a precursor, for example, a silicon-containing compound, a germanium-containing compound, and a dopant material. The silicon-containing compound includes, but is not limited to, silane ($SiH_4$), disilane ($Si_2H_6$), trisilane ($Si_3H_8$), dichlorosilane ($SiH_2Cl_2$), and penta-chloro silane. The germanium-containing compound includes, for example, germane (GeH4). Thus, the first epitaxial-grown doped layer 52 includes silicon germanium, which provides strain to the channel region 20. Alternatively, the first epitaxial-grown doped layer 52 includes, for example, silicon carbide, single crystalline silicon or any single crystalline semiconductor material that can be epitaxial-grown. Further, the first epitaxial-grown doped layer 52 is doped in-situ with p-type or n-type dopants during the epitaxial deposition 91. The in-situ dopant is oppositely positioned to the polarity of the channel region 20 including, for example, boron, germanium, indium, phosphorous, arsenic, and/or antimony. During the epitaxial deposition 91, an amount of the germanium gradually increases so as to form a gradient distribution. Alternatively, the dopant concentration of the epitaxial deposition 91 is constant so as to form a constant distribution.

Figure 4:
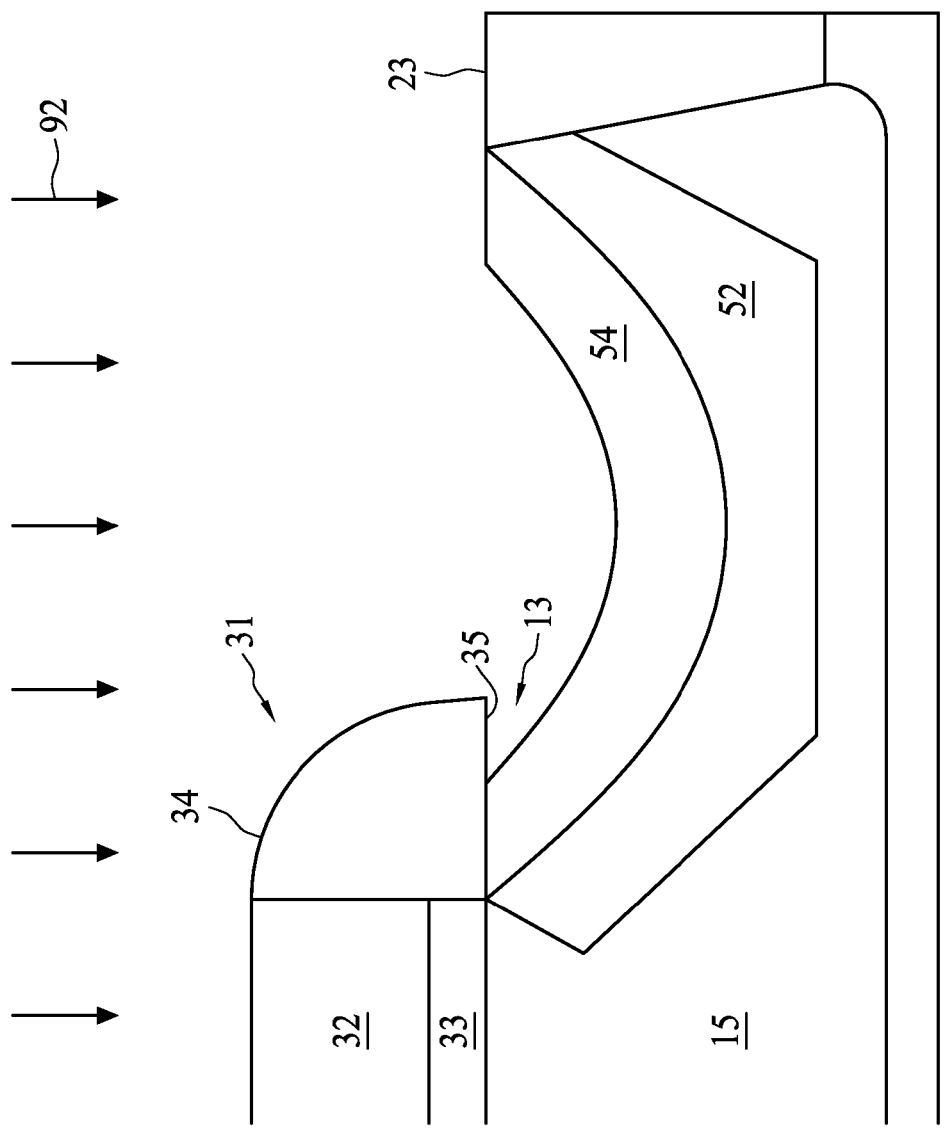

Referring to FIG. 4, an epitaxial deposition 92 is performed to selectively form a second epitaxial-grown doped layer 54 on the first epitaxial-grown doped layer 52. During the epitaxial deposition 92, the first epitaxial-grown doped layer 52 serves as a seed layer for the second epitaxial-grown doped layer 54. The epitaxial deposition 92 backfills a portion of the corner 13 underneath the gate structure 31. The epitaxial deposition 92 includes the same dopant species and semiconductor material as the epitaxial deposition 91. The difference is that the germanium concentration and the dopant concentration in epitaxial deposition 92 are greater than those of the epitaxial deposition 91, thus allowing the second epitaxial-grown doped layer 54 to be formed with a higher germanium concentration and a higher dopant concentration. During the epitaxial deposition 92, an amount of the germanium gradually increases so as to form a gradient distribution. Alternatively, the dopant concentration of the epitaxial deposition 92 is constant so as to form a constant distribution.

Figure 5:
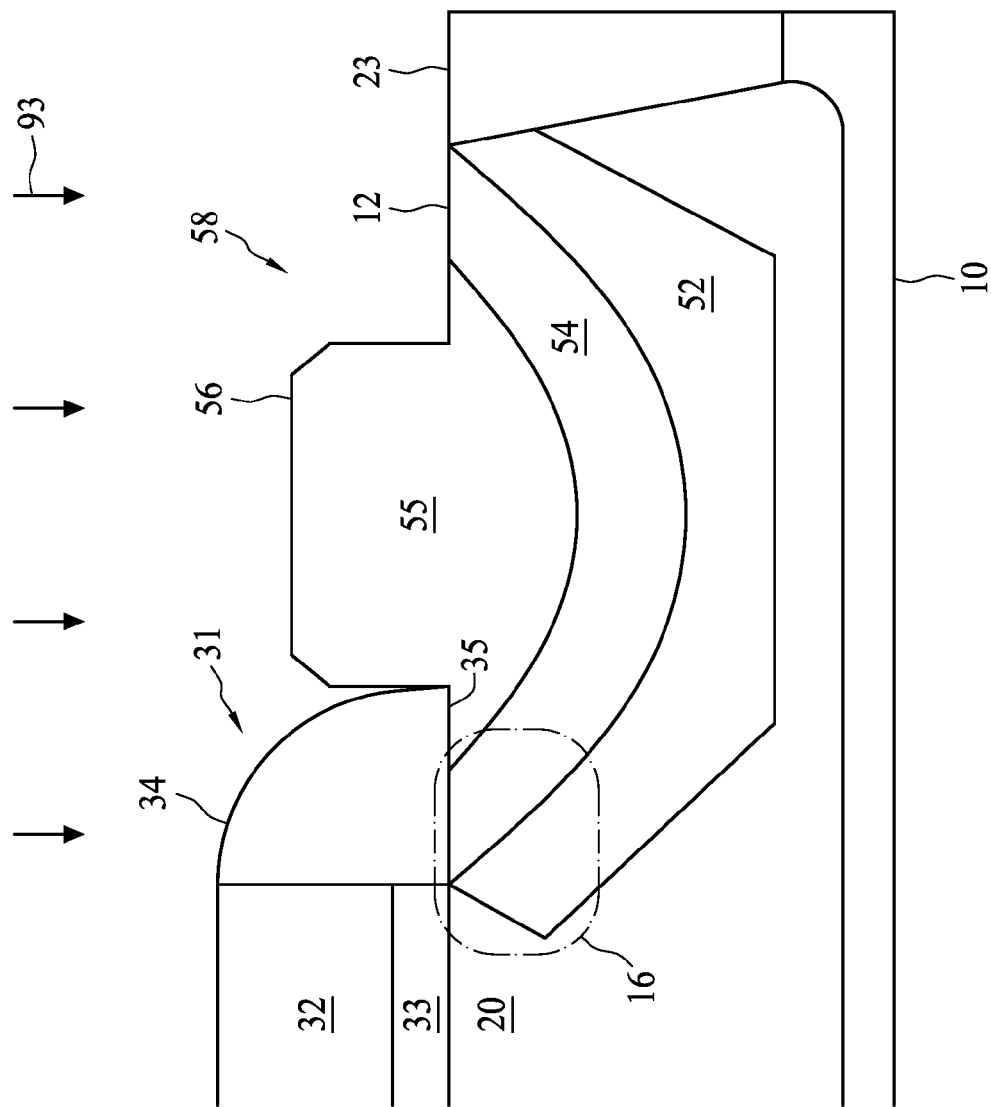

Referring to FIG. 5, an epitaxial deposition 93 is performed to selectively form a third epitaxial-grown doped layer 55 on the second epitaxial-grown doped layer 54. The second epitaxial-grown doped layer 54 serves as a seed layer during the epitaxial deposition 93. The epitaxial deposition 93 fills up a remaining portion of the corner 13 underneath the gate structure 31. After the corner 13 is sealed, the epitaxial deposition 93 continues to deposit so that a top surface 56 elevates from a surface 12 of the substrate 10. The first, second and third epitaxial-grown doped layers (52, 54, and 55) are combined so as to form a raised source/drain region 58 adjacent to the gate structure 31. Since the first, second and third epitaxial-grown doped layers (52, 54, and 55) are selectively formed, the raised source/drain region 58 has a character of the single crystalline bonding. The epitaxial deposition 93 includes the same dopant species and semiconductor material as the epitaxial depositions 91 and 92. The difference is that the germanium concentration and the dopant concentration of the epitaxial deposition 93 are greater than those of the epitaxial deposition 92, thus allowing the third epitaxial-grown doped layer 55 to be formed with a higher germanium concentration and a higher dopant concentration. During the epitaxial deposition 93, an amount of the germanium gradually increases so as to form a gradient distribution. Alternatively, the dopant concentration of the epitaxial deposition 93 is constant so as to form a constant distribution.

The corner 13 is filled up with the epitaxial-grown materials so as to form an epitaxy-tip 16 under the gate structure 31. By forming the epitaxy-tip 16 in relatively close proximity to the channel region 20, a larger hydrostatic stress is induced on the channel region 20, resulting in higher carrier mobility and increased drive current.

In comparison of germanium concentrations, the first epitaxial-grown doped layer 52 includes a germanium concentration in a range from about 10% to about 40%. The second epitaxial-grown doped layer 54 includes a germanium concentration in a range from about 40% to about 55%. The third epitaxial-grown doped layer 55 includes a germanium concentration in a range from about 55% to about 65%. In an embodiment, the first epitaxial-grown doped layer 52 includes a germanium concentration in a range from about 10% to about 30%. The second epitaxial-grown doped layer 54 includes a germanium concentration in a range from about 40% to about 50%. The third epitaxial-grown doped layer 55 includes a germanium concentration in a range from about 50% to about 70%. The third epitaxial-grown doped layer 55 includes a highest germanium concentration among the first, second and third epitaxial-grown doped layers (52, 54, and 55).

In comparison of germanium concentrations, the first epitaxial-grown doped layer 52 includes a dopant concentration ranging from about 1e19 atoms per $cm^3$ to about 2e20 atoms per $cm^3$. The second epitaxial-grown doped layer 54 includes a dopant concentration ranging from about 2e20 atoms per $cm^3$ to 6e20 atoms per $cm^3$. The third epitaxial-grown doped layer 55 includes a dopant concentration ranging from about 6e20 atoms per $cm^3$ to 2e21 atoms per $cm^3$. In an embodiment, the first epitaxial-grown doped layer 52 includes a dopant concentration ranging from about 1e18 atoms per $cm^3$ to about 1e20 atoms per $cm^3$. The second epitaxial-grown doped layer 54 includes a dopant concentration ranging from about 1e20 atoms per $cm^3$ to 8e20 atoms per $cm^3$. The third epitaxial-grown doped layer 55 includes a dopant concentration ranging from about 8e20 atoms per $cm^3$ to 3e21 atoms per $cm^3$. In an embodiment, the first epitaxial-grown doped layer 52 includes a dopant concentration ranging from about 5e20 atoms per $cm^3$ to about 6e21 atoms per $cm^3$. The second epitaxial-grown doped layer 54 includes a dopant concentration ranging from about 7e21 atoms per $cm^3$ to 1e22 atoms per $cm^3$. The third epitaxial-grown doped layer 55 includes a dopant concentration greater than 1e22 atoms per $cm^3$. The third epitaxial-grown doped layer 55 includes a highest dopant concentration among the first, second and third epitaxial-grown doped layers (52, 54, and 55).

Figure 6:
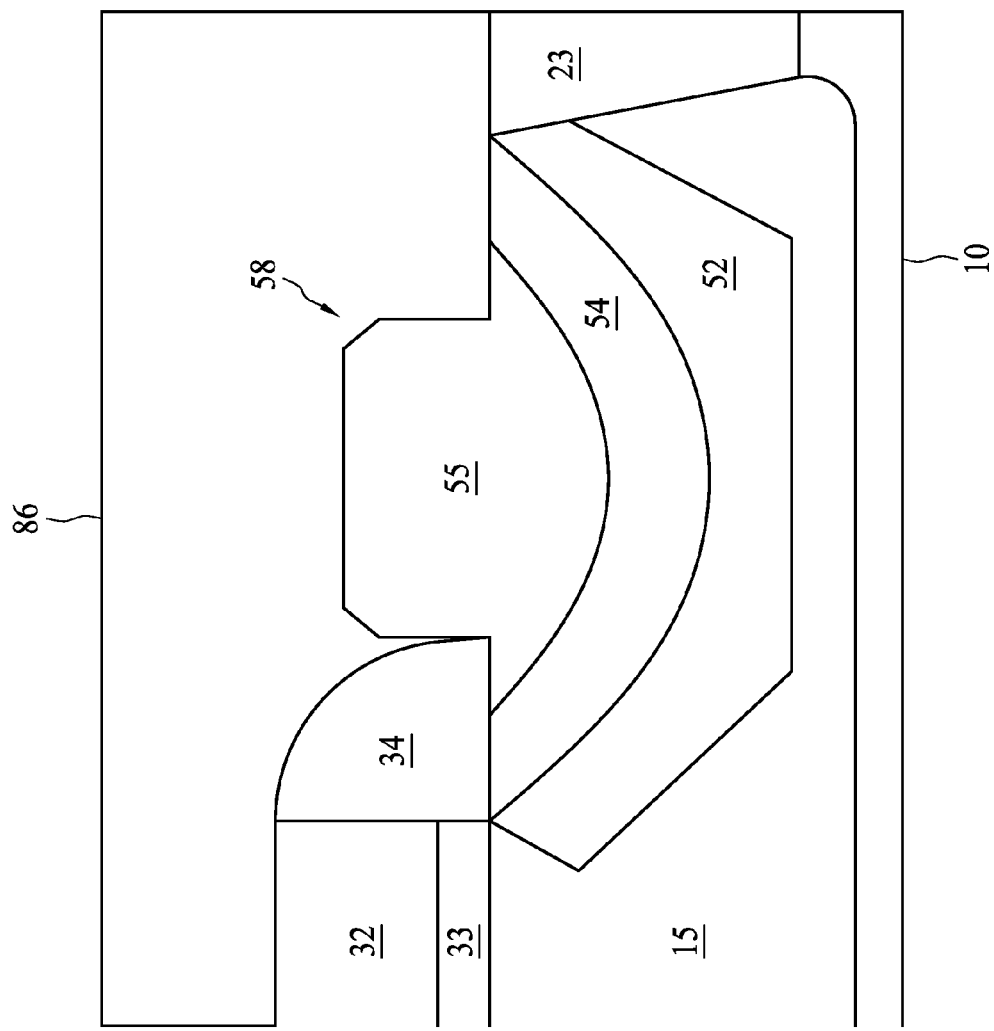

Referring to FIG. 6, a dielectric layer 86 is deposited over the substrate 10. The dielectric layer 86 includes, for example, a layer of borophosphosilicate glass (BPSG) between 5,000 and 15,000 Angstroms thickness. A photoresist layer (not shown) is applied over the dielectric layer 86. A standard photolithographic technique is performed to pattern the photoresist layer.

Figure 7:
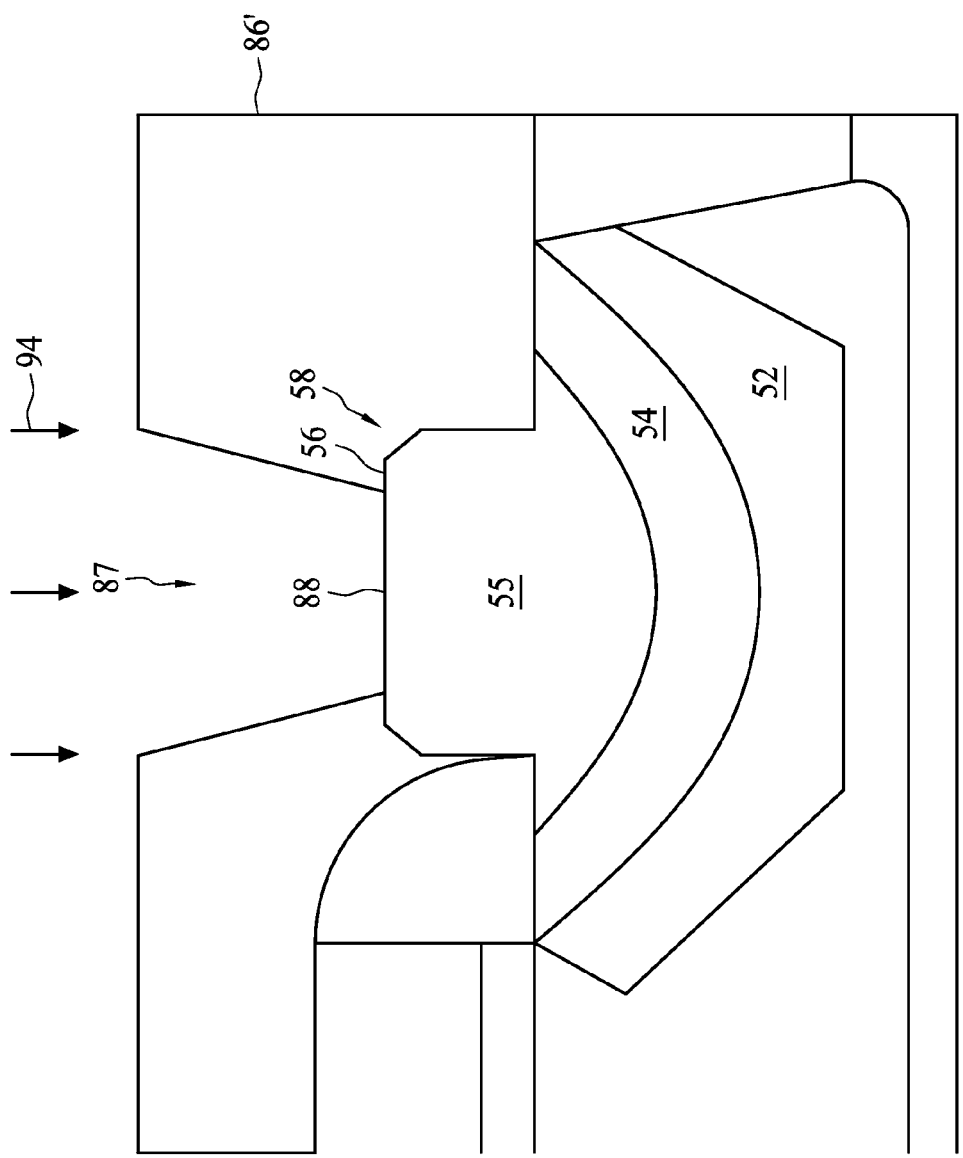

Referring to FIG. 7, an etching process 94 is employed to form a contact opening 87 in the dielectric layer 86'. The contact opening 87 exposes a portion of the top surface 56, wherein the exposed area 88 is smaller than the top surface 56. Further, the contact opening 87 tapers from the topmost portion of the dielectric layer 86' toward the top surface 56. The etch process 94 utilizes a wet etching or a dry etching process with an anisotropy feature or an isotropy feature, for example, a reactive ion etch (RIE). The etch process 94 includes chemistry molecule, which is ionized and reacts with materials of the dielectric layer 86', but not the photoresist. Further, the etch process 94 includes a chemistry molecule such as $Cl_2$, $SF_6$, $N_2$, $CF_4$, $CHF_3$, $CH_2F_2$, $N_2H_2$, $O_2$, He or Ar.

Figure 8:
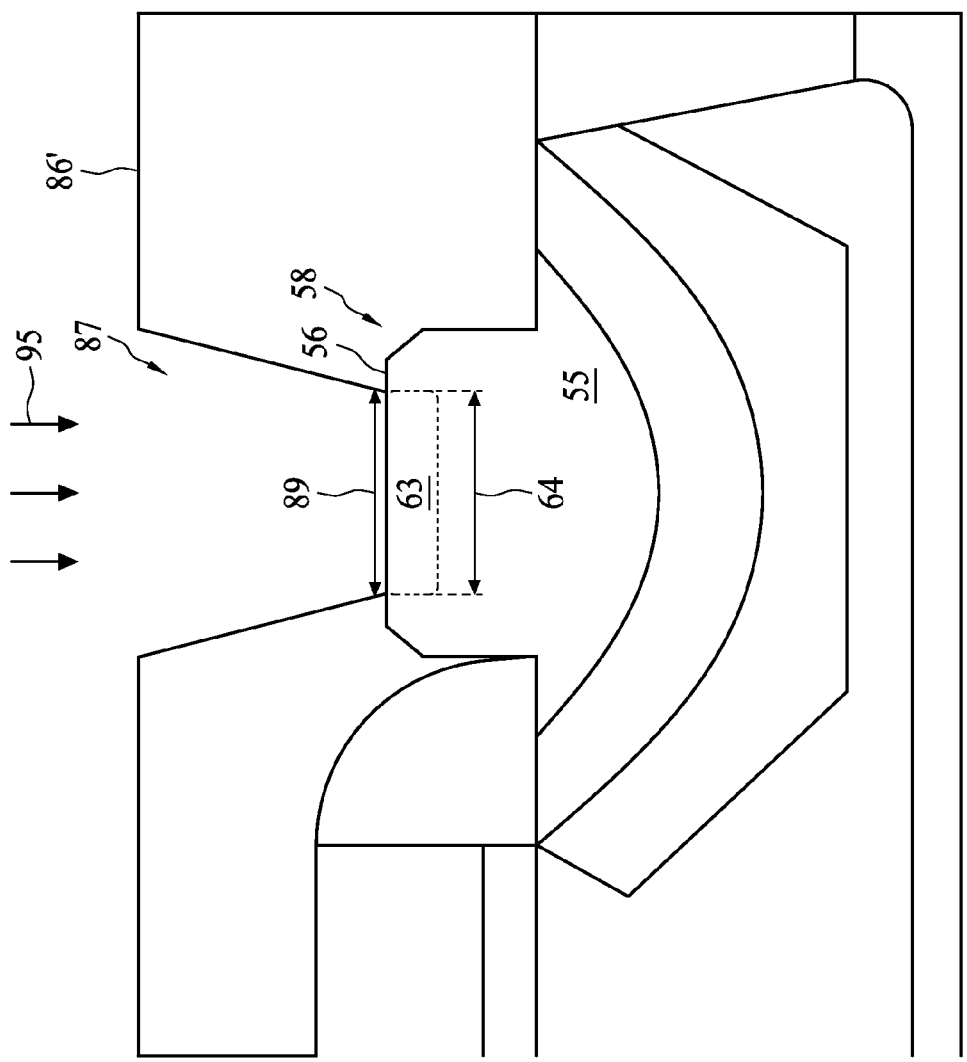

Referring to FIG. 8, a pre-amorphous implantation (PAI) 95 is performed through the contact opening 87 and implant dopant into the raised source/drain region 58. The PAI 95 includes dopant species, such as argon or xenon, which are heavy ions with the appropriate inertial properties. Since the PAI 95 includes neutral atoms, the polarity of the raised source/drain region 58 is not changed. The PAI 95 breaks the single crystalline bonding of the raised source/drain region 58 and turns the single crystalline bonding into amorphous bonding. Thus, an amorphous region 63 defined by the contact opening 87 is formed in the raised source/drain region 58. The amorphous region 63 is exposed on the top surface 56, wherein the amorphous region 63 includes a width 64 that is approximate to a bottommost width 89 of the contact opening 87. The PAI 95 includes an energy range from about 2 to 7 KeV. The PAI 95 is controlled in a lower energy range in order to keep the amorphous region 63 at a shallow depth. Having the PAI 95 at a high energy range is prohibited because a profile of the amorphous region 63 is controlled in a predetermined depth below the top surface 56 just within a few nanometers. Doses, energies, and tilt angles may be varied within the spirit and scope of this illustrative embodiment.

Figure 9:
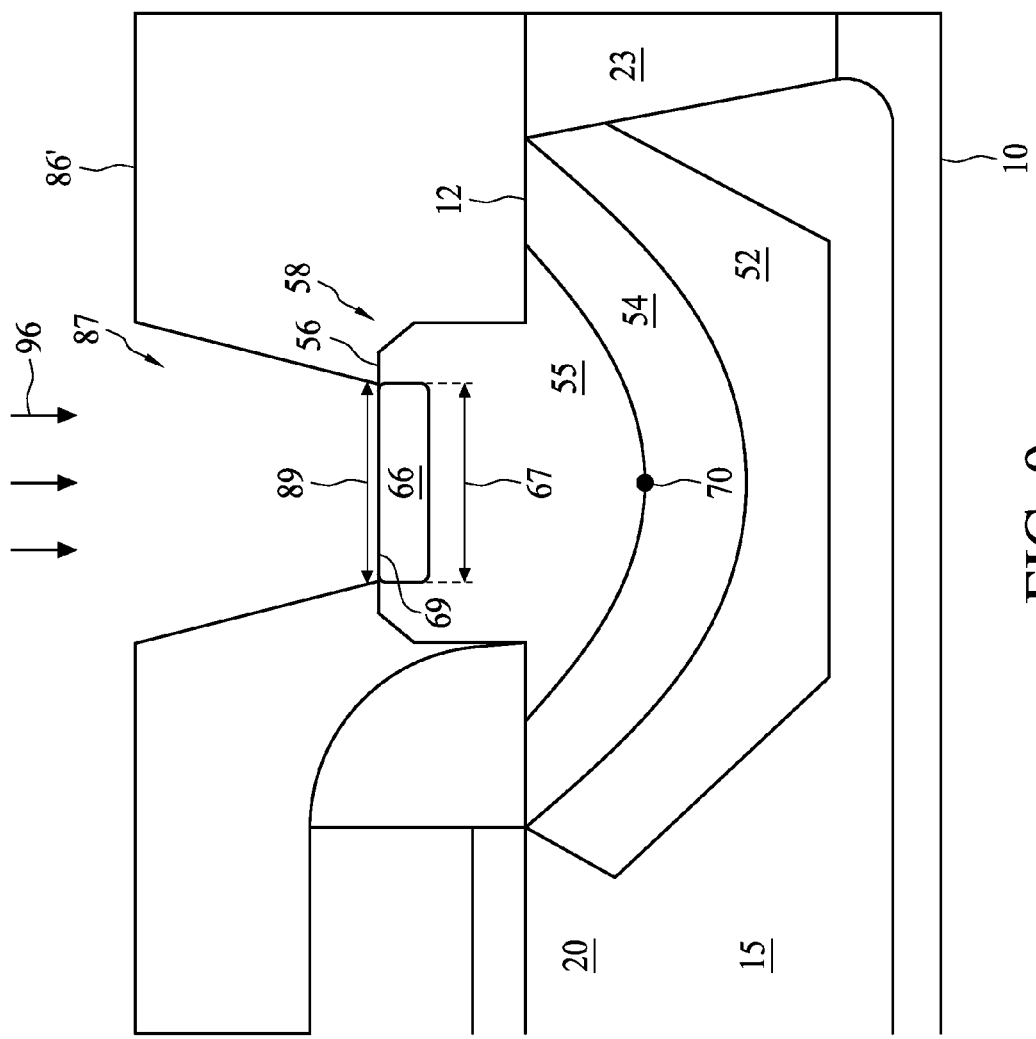

Referring to FIG. 9, an implantation 96 is performed through the contact opening 87 and implant impurities into the raised source/drain region 58. The implantation 96 includes dopant species, such as boron, germanium, indium, phosphorous, arsenic, and/or antimony, which are the same as those of the raised source/drain region 58. Further, the implantation 96 includes a dopant concentration higher than that of the epitaxial deposition 93, thus allowing a doped region 66 to form in the raised source/drain region 58. The doped region 66 includes the same dopant material as those of the first, second and third epitaxial-grown doped layers (52, 54, and 55). In addition, the doped region 66 includes a dopant concentration greater than the first, second and third epitaxial-grown doped layers (52, 54, and 55) so as to obtain a lower resistance. For example, the doped region 66 ranges from about 1e21 atoms per $cm^3$ to 1e22 atoms per $cm^3$, wherein the dopant concentration of the doped region 66 is about 1.5-10 times higher than the dopant concentration of the third epitaxial-grown doped layer 55. A profile of the doped region 66 is defined by the contact opening 87, wherein the doped region 66 includes a width 67 that is approximate to the bottommost width 89. The doped region 66 is exposed on the top surface 56, wherein the doped region 66 includes a surface area 69 that is smaller than the top surface 56. That is, the doped region 66 is encompassed by the third epitaxial-grown doped layer 55, wherein the doped region 66 includes a rectangular or a pocket profile in the third epitaxial-grown doped layer 55. The implantation 96 is controlled in a lower energy range in order to keep the doped region 66 at a shallow depth. For example, the implantation 96 includes an energy range from about 2 to 7 KeV. Having the implantation 96 at a high energy range is prohibited because a profile of the doped region 66 is controlled in a predetermined depth below the top surface 56 just within a few nanometers. Doses, energies, and tilt angles may be varied within the spirit and scope of this illustrative embodiment. In addition, since the amorphous region 63 is located at the same position as the amorphous region 63 and has been amorphized by the PAI 95, the doped region 66 has a character of the amorphous bonding. After the implantation 96, a thermal process is performed to activate the dopants in the doped region 66. The thermal process utilizes a flash annealing or a laser annealing with a short period so as not to extremely diffuse the doped region 66. After the thermal process, the doped region 66 is slightly diffused so that the width 67 of the doped region is about 0.1 nm to 20 nm greater than the bottommost width 89. The doped region 66 includes a thickness in a range from about 5 nm to 20 nm. In an embodiment, the doped region 66 includes a thickness in a range from about 20% to 80% of a thickness of the third epitaxial-grown doped layer 55. The thickness of the third epitaxial-grown doped layer 55 is measured from a bottommost point 70 to the top surface 56.

Since the doped region 66 includes a highest dopant concentration and a relative thin layer, the doped region 66 provides a low contact resistance between the raised source/drain region 58 and a following interconnector. The highest dopant concentration contributes to a high conductivity and a low resistance, which is compatible with the raised source/drain region 58 or a following metal silicide layer. The relative thin layer contributes to a short path for electrons, thus obtaining a lower resistance. The external resistance $R_{EXT}$ is thus dramatically reduced so that drive currents of the devices are increased. In addition, due to the top surface 56 being elevated from the surface 12 and the annealing control, the dopants in the doped region 66 will not diffuse into the channel region 20 or induce short channel effects.

Figure 10:
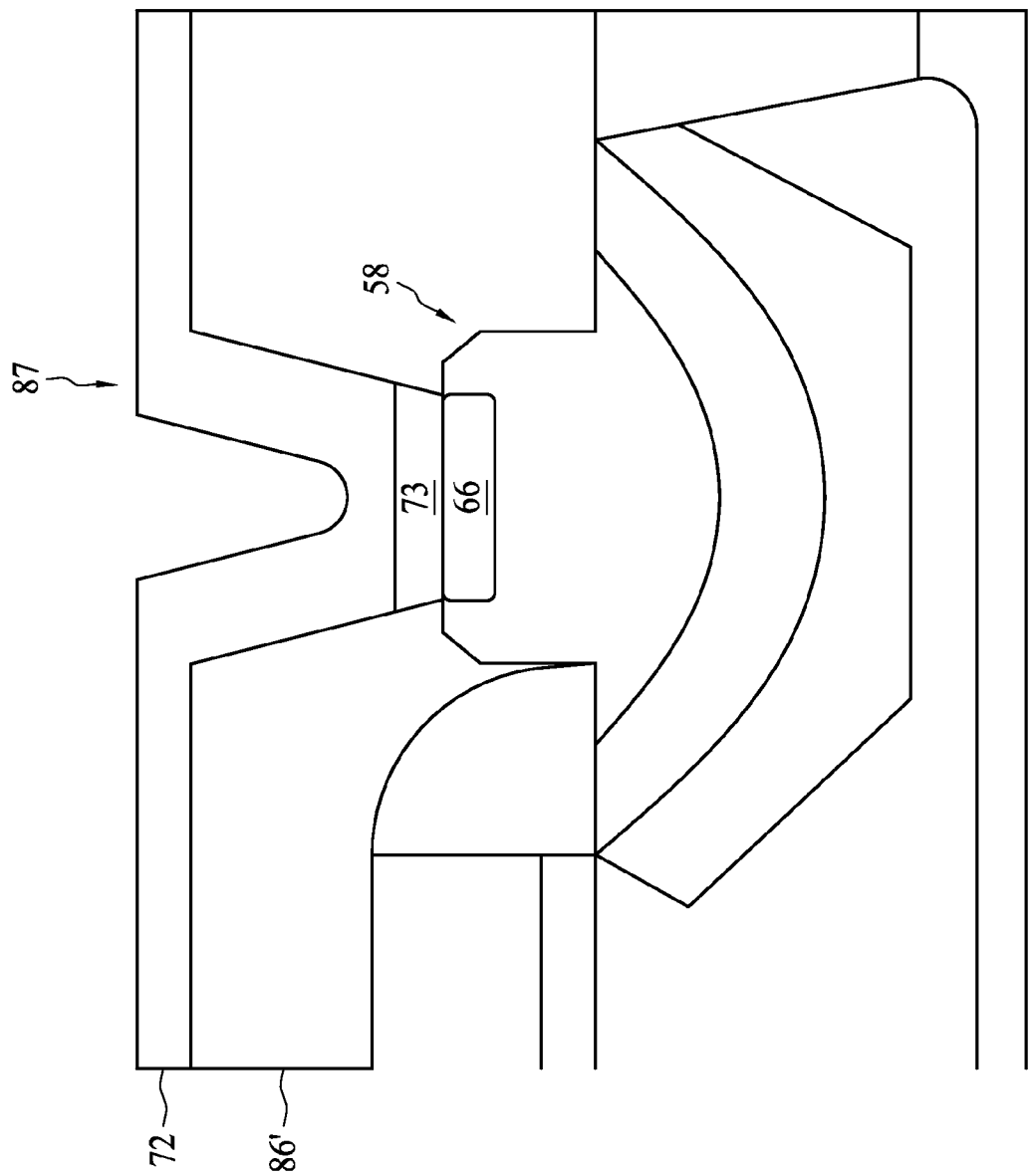

Referring to FIG. 10, a metal layer 72 is deposited to cover the dielectric layer 86' and the doped region 66. The metal layer 72 is in contact with the doped region 66 and lining the contact opening 87. Exemplary and non-limiting metals that can be deposited include nickel, platinum or titanium; and the metal thickness is several angstroms, such as about 6 angstroms to about 8 angstroms. Later, an annealing process (not shown) is performed to silicide an upper portion of the doped region 66. The annealing process thus produces a silicide region 73 which is made of, for example, NiSi, PtSi or TiSi. That is, the silicide region 73 is based on the upper portion of the doped region 66 and formed from an original interface between the metal layer 72 and the doped region 66. The silicide region 73 includes a surface area facing toward the doped region 66, wherein the surface area of the silicide region 73 is approximate to the surface area 69 of the doped region 66. Remaining portions of the metal layer 72 are stripped by a wet etch or a dry etch. Concerning the thermal budget, the annealing process also utilizes a flash annealing or laser annealing with a short period so as not to extremely diffuse the doped region 66. In addition, the silicide region 73 is formed after the contact etching of the contact opening 87, which refers to a silicide-last process. The silicide-last process prevents the doped region 66 and the silicide region 73 from phase transition resulting from the thermal budget.

Figure 11:
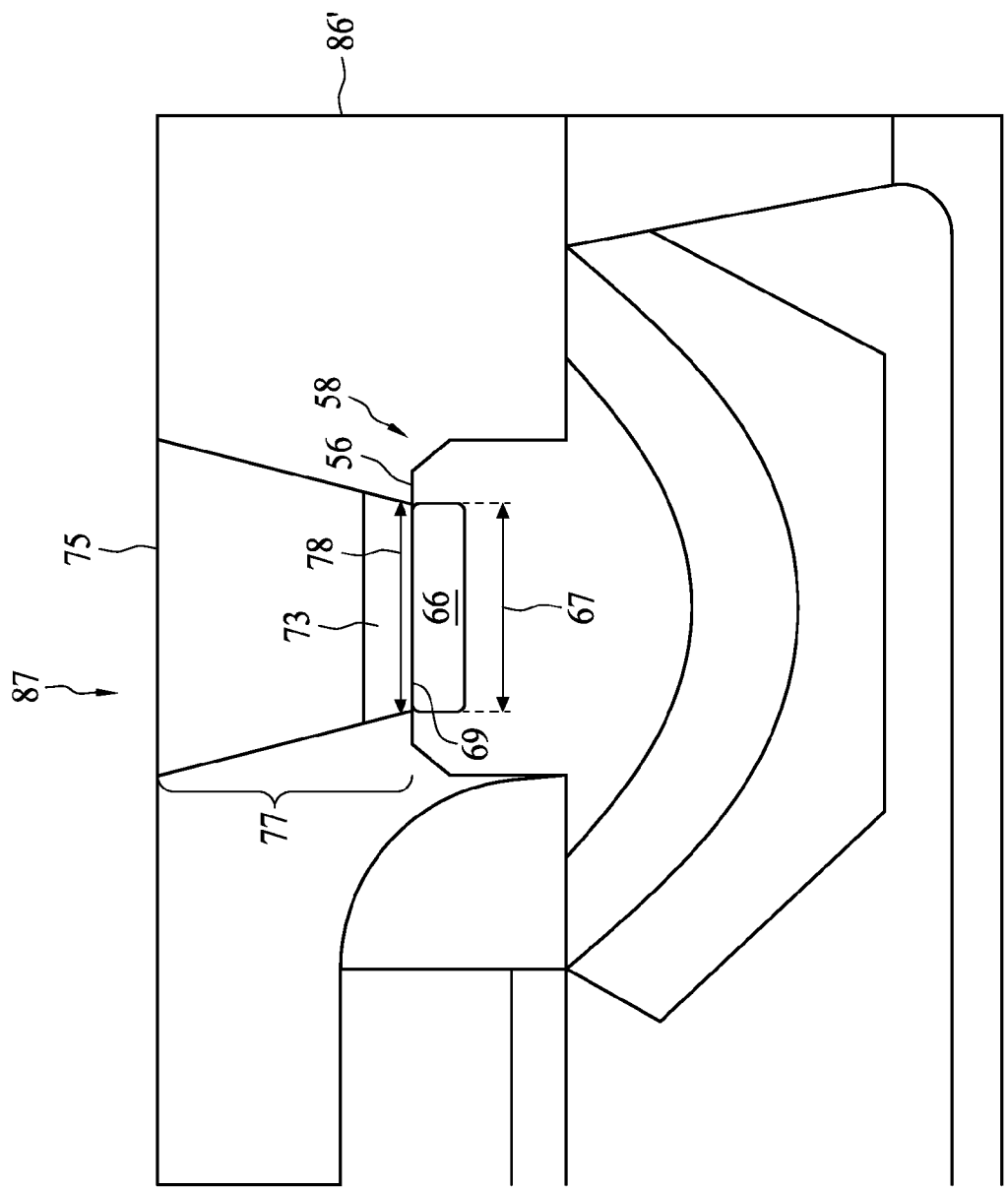

Referring to FIG. 11, a contact metal layer is deposited in a blanketed fashion into the contact opening 87 so as to be in contact with the silicide region 73. The contact metal includes copper, aluminum, or tungsten. Later, a polishing process, such as chemical mechanical polishing, is used to remove uneven portions of the contact metal layer so as to form an interconnect 75. A combination of the interconnect 75 and the silicide region 73 forms an interconnect plug 77. The silicide region 73 contacts the top surface 56, wherein a contact area is smaller than the top surface 56. Further, the silicide region 73 includes a width 78 that is approximate to the width 67 of the doped region 66. That is, the silicide region 73 covers a portion of the top surface 56 instead of blanketing the top surface 56.

In brief, a highly doped region formed between a raised source/drain region and an interconnector reduces the source/drain contact resistance. Since the source/drain contact resistance holds a majority of the external resistance $R_{EXT}$ and is reduced, drive currents of the devices are dramatically increased and boosted. In addition, due to a top surface being elevated from a surface of the substrate and an annealing control, dopants in the highly doped region will not diffuse into channel regions or induce short channel effects. Thus, the performance of the devices is improved.

A semiconductor device includes a gate structure on a substrate; a raised source/drain region adjacent to the gate structure; and an interconnect plug on the doped region. The raised source/drain region includes a top surface being elevated from a surface of the substrate; and a doped region exposed on the top surface. The doped region includes a dopant concentration greater than any other portions of the raised source/drain region. A bottommost portion of the interconnect plug includes a width approximate to a width of the doped region.

In some embodiments, the interconnect plug includes a silicide layer contacting the top surface, and a contacting area is smaller than the top surface.

In some embodiments, the doped region includes a surface area exposed on the top surface smaller than the top surface.

In some embodiments, the width of the doped region is about 0.1 nm to 20 nm greater than the width of the bottommost portion.

In some embodiments, the doped region includes a thickness in a range from about 5 nm to 20 nm.

In some embodiments, the raised source/drain region further includes a first silicon germanium layer at a bottom of the raised source/drain region; a second silicon germanium layer on the first silicon germanium layer; and a third silicon germanium layer on the second silicon germanium layer. The second silicon germanium layer includes a germanium concentration that is greater than that of the first silicon germanium layer. The third silicon germanium layer includes a germanium concentration that is greater than that of the second silicon germanium layer.

In some embodiments, the doped region is encompassed by the third silicon germanium layer.

In some embodiments, the doped region includes a thickness in a range from about 20% to 80% of a thickness of the third silicon germanium layer.

A semiconductor device includes a gate structure located on a substrate; a crystallized raised source/drain region disposed adjacent to the gate structure; and an interconnect plug on the amorphized doped region. The crystallized raised source/drain region includes a top surface above a surface of the substrate; and an amorphized doped region exposed on the top surface. The amorphized doped region includes a dopant concentration higher than any other portions of the crystallized raised source/drain region. A contacting area between the interconnect plug and the amorphized doped region is smaller than the top surface.

In some embodiments, the interconnect plug further includes a silicide layer at a bottommost portion and contacting the amorphized doped region.

In some embodiments, the silicide layer includes a surface area approximate to a surface area of the amorphized doped region exposed on the top surface.

In some embodiments, the silicide layer is based on an upper portion of the amorphized doped region.

In some embodiments, the crystallized raised source/drain region includes a first epitaxial-grown doped layer; a second epitaxial-grown doped layer including a dopant concentration higher than that of the first epitaxial-grown doped layer; and a third epitaxial-grown doped layer including a dopant concentration higher than that of the second epitaxial-grown doped layer.

In some embodiments, the dopant concentration of the amorphized doped region is about 1.5-10 times higher than the dopant concentration of the third epitaxial-grown doped layer.

In some embodiments, the amorphized doped region includes a pocket profile in the third epitaxial-grown doped layer.

In some embodiments, the amorphized doped region includes a dopant material that is the same as those of the first, second and third epitaxial-grown doped layers.

A method for manufacturing a semiconductor device includes: providing a substrate including a gate structure on the substrate; forming a cavity in the substrate and adjacent to the gate structure; epitaxially growing a semiconductor material to fill the cavity by an epitaxial deposition process, thereby forming a raised source/drain region; forming a dielectric layer over the substrate and the raised source/drain region; forming a contact opening in the dielectric layer, thus exposing a portion of the raised source/drain region; and inserting a dopant material into the raised source/drain region through the contact opening.

In some embodiments, the method further includes: generating an amorphous region in the raised source/drain region through the contact opening by a pre-amorphous implanting process.

In some embodiments, the method further includes: depositing metal into the contact opening so as to cover the dielectric layer and the portion of the raised source/drain region; and performing an annealing process to silicide the portion of the raised source/drain region.

In some embodiments, the dopant material includes a dopant concentration that is higher than that of the epitaxial deposition process, and the dopant material is the same as that of the epitaxial deposition process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure on a substrate;
   a raised source/drain region adjacent to the gate structure, wherein the raised source/drain region comprises:

a top surface being elevated from a surface of the substrate; and a doped region within the raised source/drain region and substantially coplanar with the top surface, wherein the doped region comprises a dopant concentration greater than any other portions of the raised source/drain region; and an interconnect plug on the doped region, wherein a bottommost portion of the interconnect plug comprises a width less than a width of the doped region.

2. The semiconductor device of claim 1, wherein the interconnect plug comprises a silicide layer contacting the top surface, and a contacting area is smaller than the top surface.

3. The semiconductor device of claim 1, wherein the doped region comprises a surface area exposed on the top surface smaller than the top surface.

4. The semiconductor device of claim 1, wherein the width of the doped region is about 0.1 nm to 20 nm greater than the width of the bottommost portion.

5. The semiconductor device of claim 1, wherein the doped region comprises a thickness in a range from about 5 nm to 20 nm.

6. The semiconductor device of claim 1, wherein the raised source/drain region further comprises:
a first silicon germanium layer at a bottom of the raised source/drain region;
a second silicon germanium layer on the first silicon germanium layer, wherein the second silicon germanium layer comprises a germanium concentration that is greater than that of the first silicon germanium layer; and
a third silicon germanium layer on the second silicon germanium layer, wherein the third silicon germanium layer comprises a germanium concentration that is greater than that of the second silicon germanium layer.

7. The semiconductor device of claim 6, wherein the doped region is encompassed by the third silicon germanium layer.

8. The semiconductor device of claim 6, wherein the doped region comprises a thickness in a range from about 20% to 80% of a thickness of the third silicon germanium layer.

9. A semiconductor device, comprising:
a gate structure located on a substrate;
a crystallized raised source/drain region disposed adjacent to the gate structure, wherein the crystallized raised source/drain region comprises:
a top surface above a surface of the substrate; and
an amorphized doped region within the raised source/drain region and substantially coplanar with the top surface, wherein the amorphized doped region comprises a dopant concentration higher than any other portions of the crystallized raised source/drain region; and
an interconnect plug on the amorphized doped region, wherein a contacting area between the interconnect plug and the amorphized doped region is smaller than the top surface.

10. The semiconductor device of claim 9, wherein the interconnect plug further comprises a silicide layer at a bottommost portion and contacting the amorphized doped region.

11. The semiconductor device of claim 10, wherein the silicide layer comprises a surface area approximate to a surface area of the amorphized doped region exposed on the top surface.

12. The semiconductor device of claim 10, wherein the silicide layer is based on an upper portion of the amorphized doped region.

13. The semiconductor device of claim 9, wherein the crystallized raised source/drain region comprises:
a first epitaxial-grown doped layer;
a second epitaxial-grown doped layer comprising a dopant concentration higher than that of the first epitaxial-grown doped layer; and
a third epitaxial-grown doped layer comprising a dopant concentration higher than that of the second epitaxial-grown doped layer.

14. The semiconductor device of claim 13, wherein the dopant concentration of the amorphized doped region is about 1.5-10 times higher than the dopant concentration of the third epitaxial-grown doped layer.

15. The semiconductor device of claim 13, wherein the amorphized doped region comprises a rectangular profile in the third epitaxial-grown doped layer.

16. The semiconductor device of claim 13, wherein the amorphized doped region comprises a dopant material that is the same as those of the first, second and third epitaxial-grown doped layers.

17. A semiconductor device, comprising:
a gate structure on a substrate;
an epitaxial source/drain region adjacent to the gate structure, wherein the epitaxial source/drain region comprises:
a top surface being elevated from a surface of the substrate; and
a doped region within the raised source/drain region and substantially coplanar with the top surface, wherein the doped region comprises a dopant concentration greater than any other portions of the epitaxial source/drain region; and
an interconnect plug on the doped region, wherein the interconnect plug comprises a silicide region contacting the top surface.

18. The semiconductor device of claim 17, wherein silicide region has a contacting area smaller than the top surface.

19. The semiconductor device of claim 17, wherein the silicide region comprises a first surface area approximate to a second surface area exposed on the top surface, of the epitaxial source/drain region.

20. The semiconductor device of claim 17, wherein the epitaxial source/drain region further comprises a tip formed under the gate structure.

* * * * *